United States Patent [19]

Takanabe et al.

[11] Patent Number: 5,388,944
[45] Date of Patent: Feb. 14, 1995

[54] VERTICAL HEAT-TREATING APPARATUS AND HEAT-TREATING PROCESS BY USING THE VERTICAL HEAT-TREATING APPARATUS

[75] Inventors: Eiichiro Takanabe, Sagamihara; Takeo Suzuki, Iruma; Tadataka Noguchi, Kitakyushu, all of Japan

[73] Assignee: Tokyo Electron Tohoku Kabushiki Kaisha, Japan

[21] Appl. No.: 13,366

[22] Filed: Feb. 4, 1993

[30] Foreign Application Priority Data

Feb. 7, 1992 [JP] Japan ................................. 4-057002

[51] Int. Cl.6 ............................................ B65G 49/07
[52] U.S. Cl. ............................ 414/217; 118/719; 204/298.25; 414/939; 414/786
[58] Field of Search ............... 414/217, 786, 939, 940, 414/156, 158, 172, 173, 198, 331; 118/719, 725, 729; 432/239, 241, 253; 204/298.07, 298.09, 298.25, 298.35

[56] References Cited

U.S. PATENT DOCUMENTS

| | | | |
|---|---|---|---|
| 4,388,034 | 6/1983 | Takahashi | 414/939 X |
| 4,442,338 | 4/1984 | Yamazaki | 204/298.35 X |
| 4,725,204 | 2/1988 | Powell | 118/719 X |
| 4,785,962 | 11/1988 | Toshima | 118/719 |
| 4,797,054 | 1/1989 | Arii | 414/939 X |
| 4,825,808 | 5/1989 | Takahashi et al. | 220/260 |
| 4,883,020 | 11/1989 | Kasai et al. | 118/719 |
| 4,938,691 | 7/1990 | Ohkase et al. | 414/156 X |
| 4,962,726 | 10/1990 | Matsushita et al. | 414/939 X |
| 4,990,047 | 2/1991 | Wagner et al. | 414/939 X |
| 5,002,793 | 3/1991 | Arai | 118/719 X |
| 5,207,578 | 5/1993 | Sakata | 432/241 |
| 5,223,001 | 6/1993 | Saeki | 118/719 X |

FOREIGN PATENT DOCUMENTS

90/10949 9/1990 WIPO .

*Primary Examiner*—David A. Bucci
*Attorney, Agent, or Firm*—Beveridge, DeGrandi, Weilacher & Young

[57] ABSTRACT

A wafer loading and unloading chamber is provided at the bottom of a reaction tube of a heat treatment section, a robot chamber and cassette chamber are coupled via gate valves to the wafer loading and unloading chamber, the robot chamber comprises a first load lock chamber while the wafer loading and unloading chamber comprises a second load lock chamber. These first and second load lock chambers are mutually connected by a pressure balancing gas conduit via pressure balancing valves. During heat treatment of the target objects, the wafer loading and unloading chamber and robot chamber are first set to inert gas atmospheres, then the pressure balancing gas conduit valves are opened to balance the pressures of the robot and cassette chambers. Gate valves between these chambers are then opened, and the cassette is conveyed via the robot chamber to a wafer boat in the wafer loading and unloading chamber. By this process gas flow between the two chambers when the gate valves are opened is suppressed to allow minimizing the production of particles.

17 Claims, 5 Drawing Sheets

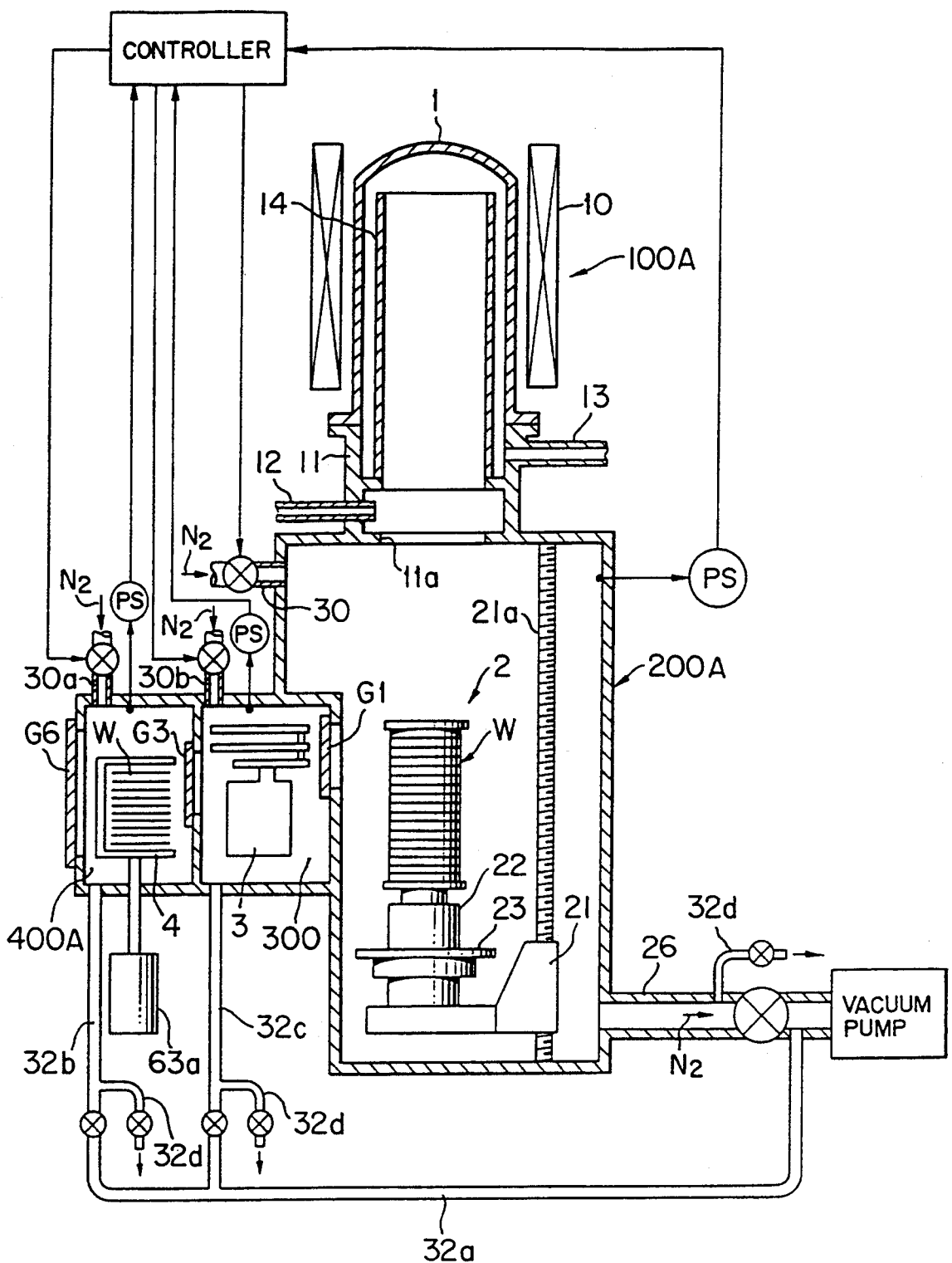
F I G. 1

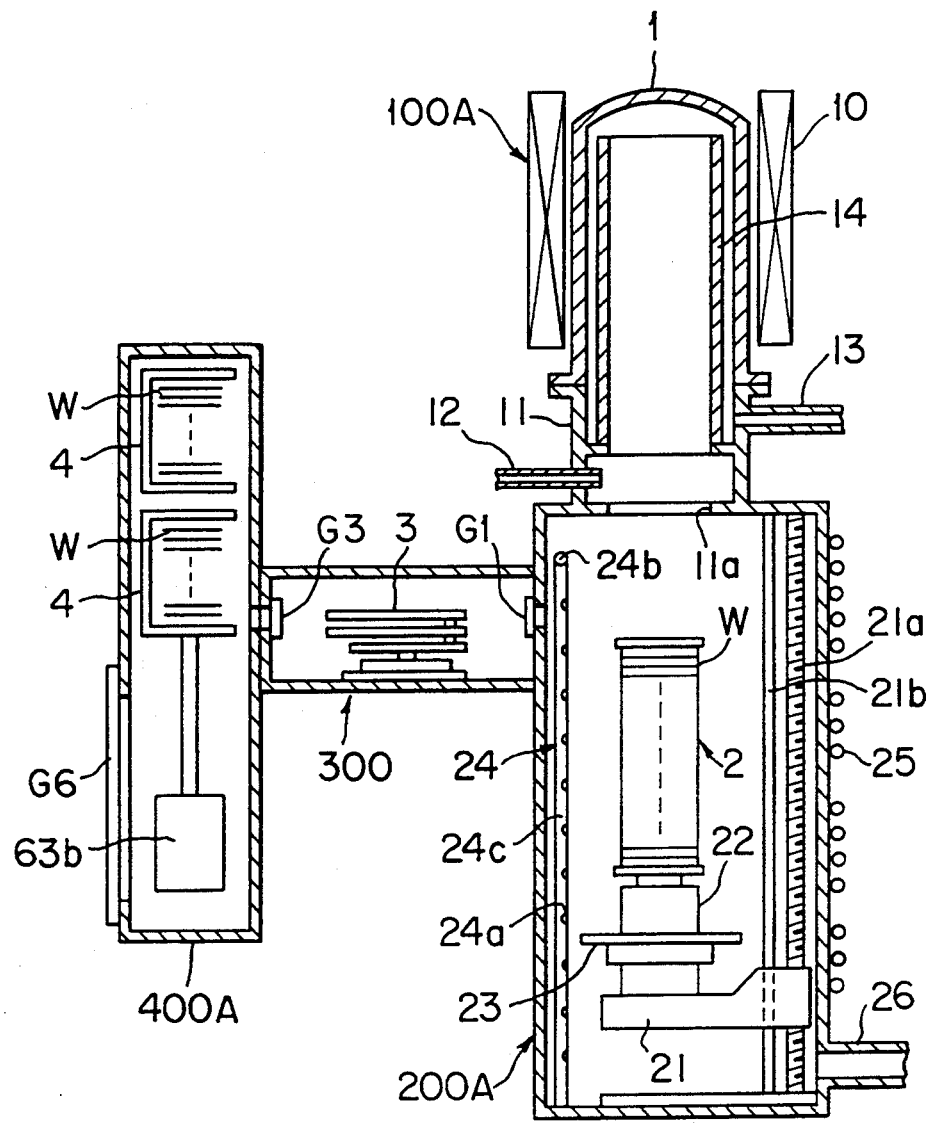
F I G. 3

VERTICAL HEAT-TREATING APPARATUS AND HEAT-TREATING PROCESS BY USING THE VERTICAL HEAT-TREATING APPARATUS

BACKGROUND OF THE INVENTION

The present invention relates to a heat-treating apparatus and heat-treating process by using the apparatus for treating such target objects as semiconductor wafers.

In recent years, the continuously increased density of semiconductor integrated circuits has placed severe demands on the characteristics of semiconductor manufacturing equipment.

For example, horizontal type furnaces were the main type of systems for heat-treating semiconductor wafers by such methods as CVD, scattering, oxidation and others. However, when a wafer boat loading semiconductor wafers is loaded in the reaction chamber (tube), reverse flow due to the temperature differential between the interior and exterior of the furnace causes air to enter the reaction tube. This promotes formation of a natural oxidation film on the wafer, and the resulting effect on wafer characteristics has been a problem. For this reason, vertical type heat-treating apparatus have gained attention in recent years.

Another factor has been the recent shift in such demands as DRAM capacity to 4M byte and 16M byte types, leading to still further increase in the density of semiconductor integrated circuits. This necessitates even further suppression of natural oxidation film formation due to air incursion during load or unload, and wafer adhesive components in vertical heat-treatment apparatus as well.

In view of these factors, studies have included construction of the bottom region of the reaction tube of a vertical heat-treatment apparatus as a load lock chamber, in which wafer boat loading and unloading are performed under an inert gas atmosphere.

However, in realizing this type of method, still further refinement is essential regarding the means of wafer transfer between the wafer boat and exterior of the apparatus. Ample consideration is also required with respect to such points as the necessary machinery and equipment space, exchanging the load lock chamber atmosphere, facilitating maintenance, and heat-treatment apparatus start-up time after maintenance.

SUMMARY OF THE INVENTION

This invention provides a heat-treatment apparatus and heat-treatment process that can resolve problems such as those mentioned above by strongly suppressing the formation of a natural oxidation film on the wafers. Furthermore, overall compact design is enabled even in systems using a plurality of reaction tubes, while maintenance can also be easily performed.

In the preferred embodiment of this invention as a vertical heat-treatment apparatus, a plurality of target objects is loaded in a target object loading means and inserted into a vertical type reaction tube within which target object heat-treatment is performed. A conveying means provided in a first load lock chamber transports the target objects into and out of the reaction tube area. A second load lock chamber provides means for securing and removing the target objects in the conveying means.

After conveying a plurality of target objects in the first load lock chamber, an inert gas atmosphere is provided throughout the first load lock chamber. The second load lock chamber is prepared with an inert gas atmosphere, after which the conveyor means sequentially conveys the plurality of target objects housed in the first load lock chamber to the receptacle of the second load lock chamber.

The two load lock chambers are mutually coupled via gate valves. After setting these chambers for the specified gas atmospheres, in the process of shifting the target objects from within one load lock chamber through the gate valve to the other load lock chamber, the two load lock chambers are mutually connected via balancing valves to a pressure balancing gas conduit. Before the gate valve opens, the balancing valve is opened to balance the gas pressure in the two load lock chambers. Afterwards, the target objects from one load lock chamber are shifted to the other load lock chamber.

Consequently, since the processes of setting the plurality of target objects in the first load lock chamber and shifting the target objects to the target object container are performed under an inert gas atmosphere, formation of a natural oxidation film on the target objects is strongly suppressed. Also since this shifting mechanism is contained within the independent first load lock chamber, even in the case of systems with a plurality of reaction tubes, the shifting mechanism can be used in common with each load lock chamber, thus enabling an overall size reduction in the heat-treatment apparatus.

By applying this invention in a system where the first load lock chamber is divided for example into two sections, and a plurality of target objects is contained in one of the sections, when the gate valve is opened for shifting the target objects to the other section, gas flow due to pressure difference can be strongly suppressed, thereby preventing such effects as particle generation.

BRIEF DESCRIPTION OF THE DRAWINGS

FIG. 1 is a cross-sectional view of an outline of a vertical heat-treatment apparatus of a first embodiment of this invention, FIG. 2 indicates a cross-sectional view of a variation example of the first embodiment, FIG. 3 indicates a cross-sectional view of an outline of a vertical heat-treatment apparatus of a second embodiment of this invention.

DETAILED DESCRIPTION OF THE PREFERRED EMBODIMENTS

Following is a description of the present invention and its usage in terms of its embodiments as a heat-treatment apparatus with reference to the drawings attached.

FIRST EMBODIMENT

Figure 2:
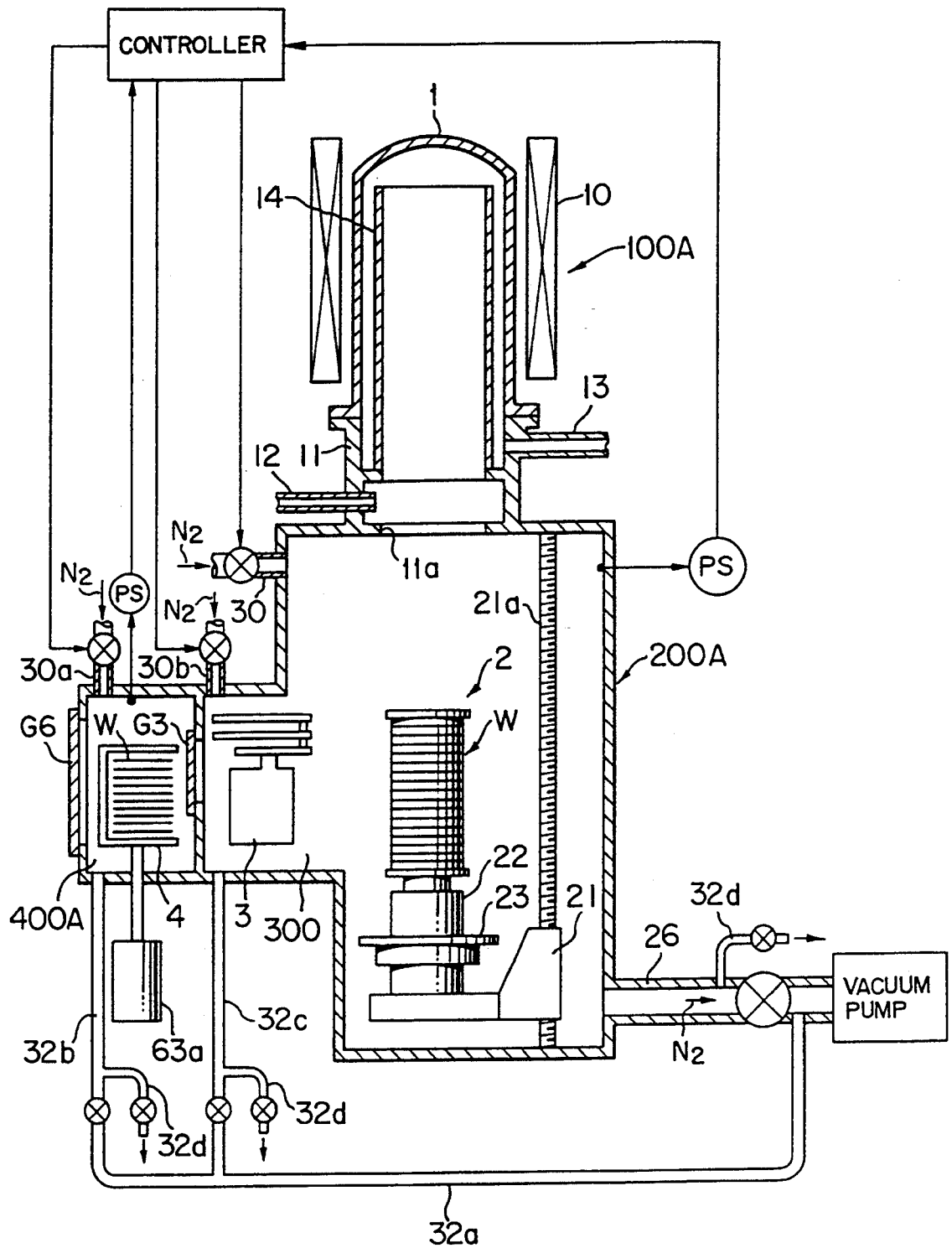

The overall composition of a vertical heat-treatment apparatus of a first embodiment of this invention is indicated in FIGS. 1 and 2.

As indicated in FIG. 1, the overall composition of a vertical heat-treatment apparatus embodiment of this invention comprises heat-treatment section 100A, wafer loading and unloading chamber (load lock chamber) 200A, target objects which are semiconductor wafers W, that are conveyed via gate valve G6 from the exterior to the interior of the apparatus, receptacle cassette chamber 400A which is coupled via gate valve G3 to robot chamber 300, and gate valve G1, which couples robot chamber 300 and wafer loading and unloading chamber 200A.

The reaction tube (process tube) 1 is formed from material such as quartz and has manifold 11 provided at the bottom. Treatment gas is exhausted and induced into the reaction tube 1 by exhaust tube 13 and gas conducting tube 12 provided with this manifold. Also, partition wall (inner tube) 14 is provided in the interior of reaction tube 1, while heater 10 encloses the exterior for heating the interior of reaction tube 1 to the required temperature.

A plurality of semiconductor wafers W are loaded in wafer boat 2 and placed on temperature holding cylinder 22. The boat elevator 21 rises to convey these from the load lock chamber into the reaction tube 1. After the wafer boat 2 is loaded, the reaction tube 1 is sealed by flange 23.

In this type of vertical heat-treatment apparatus, the operations of loading the semiconductor wafers W into wafer boat 2, and conveying wafer boat 2 loading the semiconductor wafers W into the reaction tube 1 need to be performed in an atmosphere such as $N_2$ gas, which is free from $O_2$. If these operations are performed in atmospheric air, due to $O_2$ in the air, a natural oxidation film is formed on the surfaces of the semiconductor wafers W.

For this reason, a raising and lowering means 63a, which enables feeding the wafers W at, for example, a 1–25 wafer pitch, is located within cassette chamber 400A, while a shifting means (robot) 3 for conveying the semiconductor wafers W housed in the raised and lowered wafer cassette 4 to the wafer boat 2, is located in robot chamber 300 which is adjacent to cassette chamber 400A, thus enabling introduction and removal of $N_2$ gas.

When heat-treating semiconductor wafers W by using a heat-treatment apparatus composed in this manner, first, the semiconductor wafers W are loaded into wafer boat 2 under an $N_2$ gas atmosphere. Boat elevator 21 then raises and loads wafer boat 2 into the reaction tube 1. Exhaust tube 13 is used to remove the $N_2$ gas from the reaction tube 1. When the atmosphere in the reaction tube reaches the specified vacuum, treatment gas is induced into manifold 11 by gas conducting tube 12, then the specified heat treatment is performed for the semiconductor wafers W.

At completion of heat treatment, treatment gas remaining in the reaction tube 1 is removed via exhaust tube 13, then again a vacuum is produced. When reaction tube 1 reaches the specified vacuum, $N_2$ gas is induced via gas conducting tube 12. Afterwards, when the $N_2$ gas pressure equals the $N_2$ gas pressure in the load lock chamber 200A, the wafer boat 2 is lowered by the boat elevator 21, and the semiconductor wafers W are removed from the reaction tube 1.

In order to provide an internal $O_2$ free atmosphere in load lock chamber 200A, an inert purge gas such as $N_2$ is induced via gas conducting tube 30. Load lock chamber 200A is also connected to a vacuum pump via exhaust tube 26. Together with producing a vacuum, the arrangement serves to remove induced gas via gas conducting tube 30 and air via exhaust tube 26.

In other words, $N_2$ gas for composing an $N_2$ gas atmosphere is continuously induced via gas conducting tube 30 to load lock chamber 200A, via gas conducting tube 30a to cassette chamber 400A, and via gas conducting tube 30b to robot chamber 300. At the same time, the gas is continuously discharged via gas exhaust tubes 32a, 32b, 32c and 32d as factory exhaust gas.

Pressure switch PS is provided in cassette chamber 400A, robot chamber 300A and load lock chamber 200A, respectively. The internal gas pressure is detected to allow regulation of the gas flow amount via the controller by adjusting the opening degree of appropriate valves provided for gas conducting tubes 30, 30a and 30b.

Following is a description of the operation of the vertical heat-treatment apparatus of this invention.

At start-up in the state where air ($O_2$) is present in all chambers, gate valves G3 and G1 respectively between cassette chamber 400A and robot chamber 300, and between load lock chamber 200A and robot chamber 300, are closed. The valve between exhaust tube 26 and the vacuum pump is then opened, and a vacuum is produced in load lock chamber 200A by the vacuum pump via exhaust tube 26.

The valve between exhaust tube 26 and the vacuum pump is then closed, and $N_2$ gas via the gas conducting tube 30 enters load lock chamber 200A. After normal pressure is reached in load lock chamber 200A, as $N_2$ gas continues to enter load lock chamber 200A, exhaust tube 32d valve opens and $N_2$ gas is discharged via gas conducting tube 30 to the factory exhaust. By this operation, $N_2$ gas in load lock chamber 200A is maintained at normal pressure.

The valve between gas exhaust tubes 32c and 32a opens, and the vacuum pump produces a vacuum in the robot chamber 300 via gas exhaust tube 32c. After this, the valve between gas exhaust tubes 32 and 32a closes, and $N_2$ gas is induced into the robot chamber 300 via gas conducting tube 30b. When normal pressure is reached in the robot chamber 300, as $N_2$ gas continues to enter via gas conducting tube 30b, gas exhaust tube 32d valve opens and $N_2$ gas is discharged to the factory exhaust. By this operation, $N_2$ gas in the robot chamber 300 is maintained at normal pressure.

After apparatus start-up, i.e., during normal usage, as $N_2$ gas via gas conducting tubes 30 and 30b continues to enter load lock chamber 200A and robot chamber 300, $N_2$ gas is discharged via gas exhaust tube 32d to the factory exhaust. Gate valve G6 of cassette chamber 400A opens and cassette 4 containing wafers W is loaded in cassette chamber 400A. The valve between gas exhaust tubes 32a and 32b opens, and the vacuum pump produces a vacuum in the cassette chamber 400A via gas exhaust tube 32b.

The valve between gas exhaust tubes 32a and 32b then closes, and $N_2$ gas via gas conducting tube 30a enters the cassette chamber 400. After the cassette chamber 400A reaches normal pressure, as $N_2$ gas continues to enter via gas conducting tube 30a, gas exhaust tube 32d valve opens, and $N_2$ gas is discharged to the factory exhaust. Following this, gate valve G1 between cassette chamber 400A and robot chamber 300, and load lock chamber 200A and robot chamber 300 opens, and wafers W are successively shifted to wafer boat 2.

In this manner, with the vertical heat-treatment apparatus indicated in FIG. 1, since conveyance of semiconductor wafers W to and from reaction tube 1 can be performed under an $N_2$ gas atmosphere in an $O_2$ free state, formation of a natural oxidation film on semiconductor wafers W can be prevented.

Also, as indicated in FIG. 2, robot chamber 300 and load lock chamber 200A can be unitized into a single chamber without separating valves.

SECOND EMBODIMENT

Figure 4:
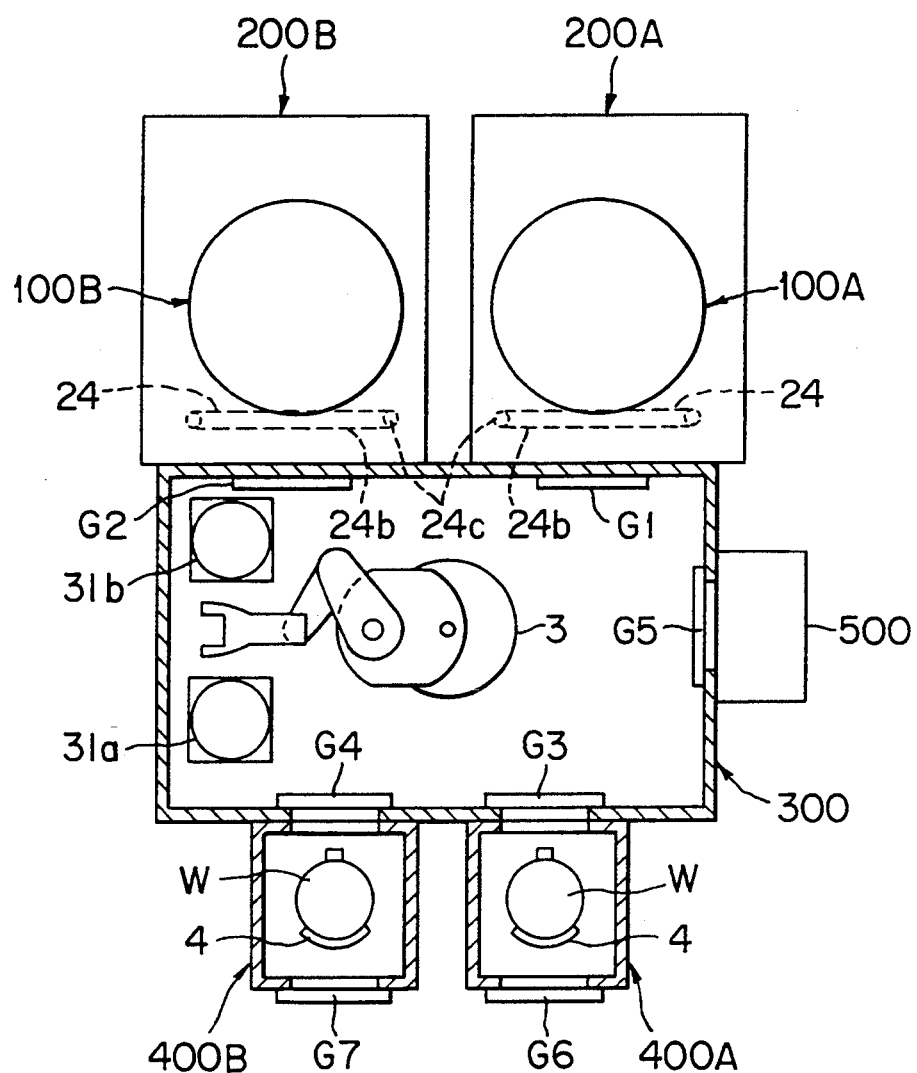
FIG. 4 is a top view of the vertical heat-treatment apparatus of FIG. 3, FIG. 5 indicates an exhaust gas tube arrangement for the vertical heat-treatment apparatus of FIG. 3.

FIGS. 3 and 4 indicate a second embodiment of this invention as applied to a vertical heat-treatment apparatus. This system is provided with heat-treatment sections 100A for performing CVD treatment and 100B for performing oxidation treatment. At the bottom of the heat-treatment sections, wafer loading and unloading chambers 200A and 200B are provided for loading and unloading wafers W in wafer boats 2.

These wafer loading and unloading chambers 200A and 200B are connected via gate valves G1 and G2 to a common robot chamber 300. In addition, this robot chamber 300 is coupled via gate valves G3 and G4 to cassette chambers 400A and 400B which store wafer cassette 4 containing wafers W.

In this second embodiment, robot chamber 300 corresponds to the first load lock chamber, and wafer loading and unloading chambers 200A and 200B correspond to the second load lock chamber.

Since heat treatment sections 100A and 100B, and cassette chambers 400A and 400B respectively utilize the same mechanisms, only one (suffix A) is described below.

Heat treatment section 100A is composed material such as quartz in a cylindrical form with the perpendicular reaction tube arranged in the axial direction. At the circumference of this reaction tube 1, heater 10 is provided for setting the reaction tube interior to the specified temperature, for example, to 500–1000 degrees C. for CVD, or to 800–1200 degrees C. for oxidation or scattering.

Partition wall (inner tube) 14 is provided in reaction tube 1, while gas conducting tube 12 is inserted at the left side of provided manifold 11 at the bottom of reaction tube 1 for inducing gas for film formation, carrier gas or other treatment gas. Exhaust tube 13 is coupled at the right side of manifold 11 and connected to a vacuum pump (not shown). Via this exhaust tube 13, the specified vacuum is produced in the reaction tube 1, or the treatment gas induced into reaction tube 1 is exhausted.

Wafer loading and unloading chamber 200A is provided with boat elevator 21 which is the raising and lowering means for conveying wafer boat 2 to and from the reaction tube 1 which is the target object treatment section. Wafer boat 2 is a means capable of loading a plurality of wafers W, such as 99 wafers, in the horizontal state and at the specified vertical direction spacing. At its bottom area, temperature holding tube 22 and flange 23 are provided atop boat elevator 21. By raising and lowering boat elevator 21, wafer boat 2 is loaded and unloaded in reaction tube 1. When wafer boat 2 is loaded in reaction tube 1, by flange 23 provided with temperature holding tube 22. Bottom opening 11a of the manifold 11 is sealed and completely shutoff from the wafer loading and unloading chamber 200A.

A plurality of gas injecting tubes 24a are provided in wafer loading and unloading chamber 200A for injecting inert gas, such as nitrogen gas, into wafer loading and unloading chamber 200A. When viewed from the front, these gas injecting tubes 24a have a ] shape (see FIG. 4). They are arranged so that their vertical tube sections 24c are positioned adjacent to both corners of robot chamber 300 of the wafer loading and unloading chamber 200A, and their horizontal tube sections 24b are positioned adjacent to the upper end.

By providing gas injecting tubes 24 within the wafer loading and unloading chamber 200A in this manner, in addition to the main function of inserting inert gas into the interior, particles produced when wafers W are set and removed from the wafer boat can be blown clear.

At the external face of the chamber composing the wafer loading and unloading chamber 200A, cooling water tube 25 is provided for internal cooling, while exhaust tube 26 is connected via the vacuum pump for producing a vacuum in wafer loading and unloading chamber 200A.

Robot chamber 300 is provided with a loading means, such as a multi-joint loading robot 3, a buffer stage 31a for temporarily holding the wafers transferred from cassette chamber 400A, and an orientation flat aligning means 31b for aligning the orientation flats of wafers W. Loading robot 3 is provided with degrees of freedom in terms of its overall arm rotation, extension and retraction, and vertical movement (FIG. 4).

In the external chamber of robot chamber 300, as indicated in FIG. 4, cleaning chamber 500 is coupled via gate valve G5. This cleaning chamber 500 is provided with a vessel containing, for example, hydrogen fluoride. By supplying inert gas, which includes a water component, through this vessel to wafers W, formation of natural oxidation film on the wafer surfaces is prevented by using hydrogen fluoride as a pretreatment to heat-treatment.

Cassette chamber 400A is provided with elevator 63b for raising and lowering two cassettes 4 while each contains, for example, 25 wafers. The two cassettes 4 are conveyed into cassette chamber 400A by elevator 63b and raised to the position indicated in FIG. 3. The wafers W are brought into robot chamber 300 in sequence starting with the bottom wafers in the cassettes 4. Conversely, when the treated wafers W are received into robot chamber 300, the cassettes 4 are lowered and the wafers are conveyed in sequence from the top.

Cassette chambers 400A and 400B are also provided with gate valves G6 and G7 for shutting them off from the air.

Next the exhaust system of the heat-treatment apparatus of this invention is described with reference to FIG. 5. TP and DP are respectively turbo element and dry pumps. The suction side of turbo element pump TP is branched via exhaust tube 6 valve VO to a plurality of exhaust tubes, which are respectively connected via valves V1–V5 to second load lock chambers 200A and 200B, first load lock chamber 300 and cassette chambers 400A and 400B. Consequently, by sequentially switching valves V1–V5, a vacuum can be produced in each section by one vacuum producing means (turbo element pump TP or dry pump DP).

Pressure switches PS are connected in first load lock chamber 300, second load lock chamber 200A, 200B and cassette chamber 400A, 400B. The internal pressure is detected and the opening degree of valves provided with gas conducting tubes can be controlled by the controller to regulate the gas flow.

Figure 5:
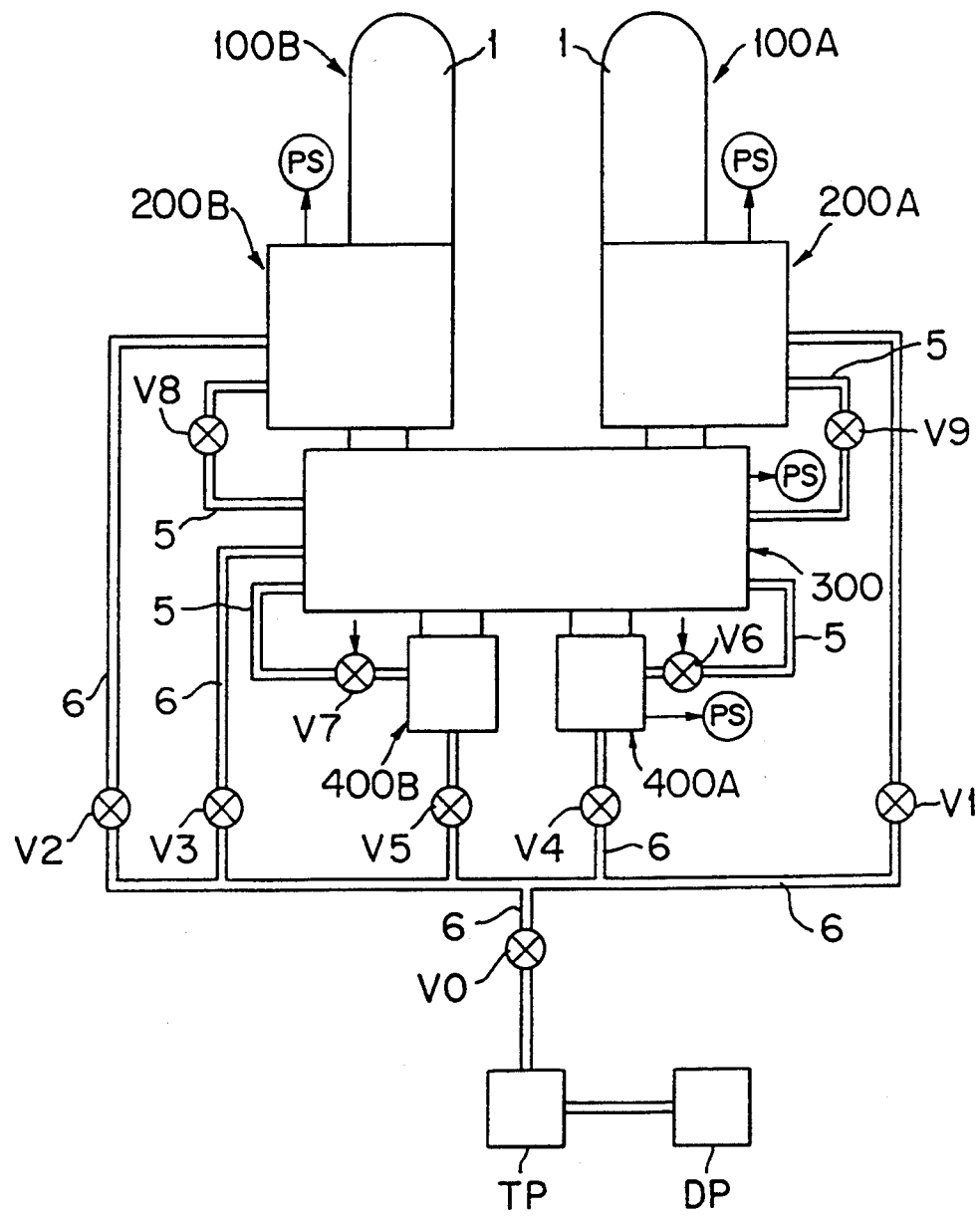

Although not indicated in FIGS. 3–5, gas conducting tubes are connected as in the first embodiment (FIG. 1) to robot chamber 300 and cassette chambers 400A and 400B to allow providing an inert gas such as nitrogen gas atmosphere. Exhaust tube 26 indicated in FIG. 3 corresponds to the suction side of valve V1 indicated in FIG. 5.

Balancing valves V6 and V7 respectively between robot chamber 300 and cassette chambers 400A and 400B, and balancing valves V8 and V9 between robot chamber 300 and wafer loading and unloading chambers 200A and 200B, are connected to, for example, a ¼-inch gas conduit (ballast) 5. This allows maintaining pressure balance between both spaces before opening gate valves G3 and G4.

Next is a description of the operation of the heat-treatment apparatus of the second embodiment. First, gate valves G1–G4 are closed by switching valves V1–V3 indicated in FIG. 5. The specified vacuum is produced in reaction tube 1, wafer loading and unloading chambers 200A and 200B and robot chamber 300 by the exhaust means (pumps TP and DP) indicated in FIG. 5.

Gas such as nitrogen is then induced into these interiors to produce a nitrogen gas atmosphere by gas conducting tube 12, gas injecting tube 24 and other gas injecting tubes not indicated in the figure.

At this time, cassette chambers 400A and 400B are at atmospheric pressure. In these two cassettes 4 storing untreated wafers W are arranged as indicated in FIG. 3. Then gate valves G6 and G7 close, and valves V4 and V5 in cassette chambers 400A and 400B open for exhausting. Afterwards, nitrogen gas is induced thereinto from the nitrogen gas conducting tube (not shown). Next, balancing valves V6 and V7 open, and gas conduit 5 opens for balancing the pressure between the robot chamber 300 and cassette chambers 400A and 400B.

Gate valves G3 and G4 then open and wafers W are removed in sequence from cassette 4 by robot 3. After wafers W are aligned by orientation flat aligning means 31b, they are conveyed, for example, to the wafer loading and unloading area 100A of wafer boat 2. While the orientation flats are being aligned, the next wafers W are stored in waiting at the buffer stage 31. In the same manner, balancing valves V8 and V9 open, opening the gas conduit for balancing the pressure between wafer loading and unloading chambers 200A and 200B, and robot chamber 300.

Following is a description of performing heat treatment with one heat treatment section 100A. As indicated in FIG. 3, wafer boat 2 is raised to the specified position for loading wafers W into wafer boat 2. Ball screw section 21a turns intermittently, and by this rotation elevator 21 lowers intermittently. With respect to this timing, robot 3 sequentially shifts wafers W from the bottom stage of wafer boat 2.

Next, after gate valve G1 closes, elevator 21 raises wafer boat 2 for loading in reaction tube 1 and flange 23 seals the bottom opening 11a. At this time, the interior of reaction tube 1 is heated to the predetermined temperature by heater 10. After producing a vacuum in reaction tube 1, treatment gas or carrier gas is induced via gas conducting tube 12 into reaction tube 1 to perform treatment of the wafers W such as CVD and on the front surfaces form a film such as polysilicon.

After completion of the film forming process, wafer boat 2 is lowered by elevator 21 to unload it from the reaction tube 1. As wafer boat 2 is lowered to the specified position, gate valves G1 and G3 open. Then elevator 21 intermittently rises and, oppositely to loading wafers W, loading robot 3 removes the wafers W in sequence from the top stage of wafer boat 2. Via gate valve G1, robot chamber 300 and gate valve G3, the wafers W are shifted to cassette 4 in cassette chamber 400.

In the above manner, heat treatment is applied to wafers W. In this embodiment, both heat treatment sections 100A and 100B can be used in parallel for heat treating wafers W. In this case, it is adequate that cassettes 4 in cassette chambers 400A and 400B are respectively conveyed to heat treatment sections 100A and 100B, then after heat treatment the wafers W are returned to respective cassettes 4.

This embodiment can also be applied to a heat treatment apparatus of unitized construction without cutoff between robot chamber 300, and cassette chambers 400A and 400B by gate valves G3 and G4. In this case, these unseparated chambers compose the first load lock chamber.

In the above manner, according to this second embodiment, since the processes of setting a cassette with, for example, a plurality of wafers in the cassette chamber, transfer to the wafer boat and subsequent stages are performed in an inert gas atmosphere, formation of a natural oxidation film on the wafers can be strongly suppressed.

Moreover, compared to using a vacuum in each load lock chamber, using an inert gas atmosphere provides the following advantages. First, in the wafer position alignment and conveying mechanisms, vacuum chucks can be used for holding the wafers. But since continuous vacuum production is unnecessary, normal pressure mechanisms can be used in each section. This avoids such problems as chamber deformation due to internal and external pressure difference.

Second, since the wafer boat positioning area, and wafer shift mechanism and cassette positioning area form separate load lock chambers, by providing a plurality of reaction tubes as in this embodiment for such processes as heat treatment, even if the reaction chambers are operated simultaneously in parallel, wafers can be loaded by a single conveying means. This provides a major advantage by easily enabling an overall compact design for the heat treatment apparatus.

Third, during maintenance of the conveying means and other sections, it is adequate to open their particular area (first load lock chamber). Consequently, since it is not necessary to open the larger second load lock chamber where wafer boat raising and lowering is performed and which requires time for atmosphere replacement, equipment startup for the next treatment is extremely easy.

Also, in this embodiment, a pressure balancing gas conduit is provided between the cassette and robot chambers. By opening the conduit, both pressures can be balanced prior to opening the gate valve between these chambers. For this reason, when the gate valve is opened, since gas flow in the chambers due to pressure difference does not occur, dust generation can be suppressed. This is extremely advantageous when treating such target objects as semiconductor wafers, which are prone to adverse effects from particles.

What is claimed is:

1. A vertical heat-treatment apparatus for heat treating target objects wherein a target object receptacle means capable of holding a plurality of target objects is moveable into a vertical reaction tube comprising:
   a first load lock chamber which maintains an inert gas atmosphere after said target objects have been conveyed thereinto;

a second load lock chamber coupled to said reaction tube which, using said target object receptacle, stores said target objects before and after heat treatment, said second load lock chamber maintaining a desired inert gas atmosphere by continuously inducing purge gas thereinto through a conducting tube and exhausting said gas therefrom through an exhaust tube, a pressure balancing gas conduit connected between said first and said second load lock chambers, said conduit including a pressure balancing valve, and a conveying means for conveying said target objects between said first load lock chamber and said second load lock chamber, thereby sequentially shifting said target objects from said first load lock chamber to said target object receptacle means of said second load lock chamber, said second load lock chamber having been kept in a inert gas atmosphere.

2. The vertical heat-treatment apparatus according to claim 1 wherein said first load lock chamber comprises a robot chamber.

3. The vertical heat-treatment apparatus according to claim 1 wherein said second load lock chamber comprises a wafer loading and unloading chamber.

4. The vertical heat-treatment apparatus according to claim 1 wherein said conveying means is provided within said first load lock chamber.

5. The vertical heat-treatment apparatus according to claim 1 wherein said target objects are semiconductor wafers.

6. The heat treatment apparatus according to claim 1 wherein said first load lock chamber comprises a cassette chamber.

7. A heat treatment process for treating target objects using a vertical heat-treatment apparatus by which a target object receptacle means capable of holding a plurality of target objects is loaded in a vertical reaction tube, said process comprising the steps of:

maintaining an inert gas atmosphere in a first load lock chamber after said target objects have been conveyed into said first load lock chamber;

continuously inducing purge gas through a conducting tube into a second load lock chamber which is coupled to said vertical reaction tube, said second load lock chamber being capable of storing said target objects before and after treatment, exhausting said purge gas from said second load lock chamber through and exhaust tube thereby maintaining an inert gas atmosphere therein, opening a balancing valve in a pressure balancing gas conduit connected between said first and said second load lock chambers to balance gas pressures between said first and said second load lock chambers, and sequentially shifting said target objects by a conveying means form said first load lock chamber into said target object receptacle means provided in said second load lock chamber, said second load lock chamber having been kept in a inert gas atmosphere.

8. The heat treatment process according to claim 7 wherein, said inert gas atmosphere is an $N_2$ gas atmosphere.

9. The heat treatment process according to claim 7 wherein the exhaust from said second load lock chamber is routed to a factory exhaust.

10. A processing apparatus for heat treating an object comprising:

a first sealable chamber for introducing objects into and removing objects from the apparatus, said first chamber having has induction and has exhausting means;

a second sealable chamber having means for loading objects into a reaction chamber, said second chamber being provided in sealable communication with said first chamber, said second chamber further having gas induction and gas exhausting means;

a pressure balancing gas conduit connected between said first and said second sealable chambers, said conduit including a pressure balancing valve, and conveying means for transferring objects between said first and said second chamber wherein during operation inert gas is continuously induced into and exhausted from said first and said second gas chambers.

11. The apparatus according to claim 10, wherein:
said conveying means is provided in a third chamber sealably interposed between said first chamber and said second chamber, said third chamber having gas induction and gas exhausting means, wherein during object processing inert gas is continuously induced and exhausted from said third chamber.

12. The apparatus according to claim 10, wherein said first chamber houses an object cassette.

13. The apparatus according to claim 10, wherein said loading means is capable of receiving a plurality of objects.

14. The apparatus according to claim 10, wherein said object is a semiconductor wafer.

15. The apparatus according to claim 10, wherein said conveying means is a robot.

16. The apparatus according to claim 10, wherein said first chamber and said second chamber are provided with pressure sensing means to monitor the flow of inert gas therein.

17. The apparatus according to claim 10, wherein said exhausting means are connected to a vacuum pump.

* * * * *